United States Patent
Sini et al.

(10) Patent No.: US 11,310,027 B2
(45) Date of Patent: Apr. 19, 2022

(54) METHOD OF DATE-STAMPING TELEMETRY SIGNALS

(71) Applicant: SAFRAN DATA SYSTEMS, Courtaboeuf (FR)

(72) Inventors: Youcef Sini, Rungis (FR); Alain Thomas, Clamart (FR); Nicolas Pasternak, Fontenay aux Roses (FR)

(73) Assignee: SAFRAN DATA SYSTEMS, Courtaboeuf (FR)

( * ) Notice: Subject to any disclaimer, the term of this patent is extended or adjusted under 35 U.S.C. 154(b) by 0 days.

(21) Appl. No.: 17/272,036

(22) PCT Filed: Aug. 30, 2019

(86) PCT No.: PCT/EP2019/073264
§ 371 (c)(1),
(2) Date: Feb. 26, 2021

(87) PCT Pub. No.: WO2020/043905
PCT Pub. Date: Mar. 5, 2020

(65) Prior Publication Data
US 2021/0351907 A1    Nov. 11, 2021

(30) Foreign Application Priority Data
Aug. 31, 2018   (FR) ...................................... 1857873

(51) Int. Cl.
*H04L 7/033* (2006.01)
*H04L 27/00* (2006.01)

(52) U.S. Cl.
CPC .......... *H04L 7/033* (2013.01); *H04L 27/0014* (2013.01)

(58) Field of Classification Search
CPC ........................... H04L 7/033; H04L 27/0014
See application file for complete search history.

(56) References Cited

U.S. PATENT DOCUMENTS 3,629,712 A * 12/1971 Clark .................... H04L 7/033
                                                              327/12
3,787,775 A *  1/1974 Lanning .............. H04L 27/2273
                                                              329/308
(Continued)

FOREIGN PATENT DOCUMENTS

CA      2284948 A1 *  4/2001   ............. H03D 3/245
CA      3110838 A1 *  3/2020   ............. H03D 3/006
(Continued)

OTHER PUBLICATIONS

French Written Opinion and Search Report dated Jun. 20, 2019, for French Application No. FR1857873, with an English translation of the Written Opinion.
(Continued)

*Primary Examiner* — Berhanu Tadese
(74) *Attorney, Agent, or Firm* — Birch, Stewart, Kolasch & Birch, LLP.

(57) ABSTRACT

A method of date-stamping reception of digital data of a signal coherently modulating the carrier or sub-carrier, and utilizing the properties of such a modulation to improve the date-stamping thereof. Thereby accurately correcting the date-stamping of a pilot sequence (known pattern), and reducing the variance on the date-stamping of the transitions of the bits.

15 Claims, 8 Drawing Sheets

(56) References Cited

U.S. PATENT DOCUMENTS

| | | | | |
|---|---|---|---|---|
| 3,815,029 A * | 6/1974 | Wilson | H04L 27/2276 | 375/329 |
| 4,092,491 A * | 5/1978 | Frazer | H04L 27/2082 | 341/143 |
| 4,105,975 A * | 8/1978 | Sanders | H04L 27/2273 | 375/327 |
| 4,241,454 A * | 12/1980 | Snell | H04L 27/2272 | 329/304 |
| 4,301,417 A * | 11/1981 | Jansen | H04L 27/2273 | 329/310 |
| 4,313,219 A * | 1/1982 | Gabler | H03J 7/04 | 455/260 |
| 4,417,213 A * | 11/1983 | Ito | G11B 20/10009 | 327/100 |
| 4,539,524 A * | 9/1985 | Goode | H04L 27/2276 | 329/300 |
| 4,584,533 A * | 4/1986 | Huffman | H04L 27/2332 | 329/306 |
| 4,592,071 A * | 5/1986 | Prigent | H04L 27/2071 | 329/346 |
| 4,603,393 A * | 7/1986 | Laurent | H04L 27/2332 | 329/306 |
| 4,627,079 A * | 12/1986 | von der Embse | H04L 27/2272 | 324/76.21 |
| 4,675,881 A * | 6/1987 | Chung | H04L 27/233 | 327/122 |
| 4,694,257 A * | 9/1987 | Klein | H04L 27/2335 | 329/302 |
| 4,829,260 A * | 5/1989 | Goodchild | H04L 27/2276 | 329/304 |
| 4,860,321 A * | 8/1989 | von der Embse | H04L 25/067 | 375/343 |
| 4,894,845 A * | 1/1990 | Janssen | H04L 27/2277 | 375/329 |
| 5,063,387 A * | 11/1991 | Mower | H04B 7/18506 | 342/103 |
| 5,151,925 A * | 9/1992 | Gelin | H04L 27/2332 | 375/328 |
| 5,208,836 A * | 5/1993 | Edbauer | H04L 27/2332 | 329/304 |
| 5,440,267 A * | 8/1995 | Tsuda | H04L 7/0334 | 329/308 |
| 5,541,955 A * | 7/1996 | Jacobsmeyer | H04L 1/0009 | 375/222 |
| 5,748,036 A * | 5/1998 | Lee | H04L 27/148 | 329/300 |
| 5,784,402 A * | 7/1998 | Feher | H04L 27/38 | 375/130 |
| 5,790,594 A * | 8/1998 | Peng | H04L 7/10 | 370/516 |
| 5,875,212 A * | 2/1999 | Fleek | H04L 27/2337 | 375/329 |
| 5,881,110 A * | 3/1999 | Cochran | H04L 27/2332 | 375/324 |
| 5,898,737 A * | 4/1999 | Chethik | H04L 27/3827 | 375/235 |
| 5,953,385 A * | 9/1999 | Mortensen | H04L 27/2332 | 375/354 |
| 6,028,888 A * | 2/2000 | Roux | H04B 1/707 | 370/208 |
| 6,072,785 A * | 6/2000 | Ho | H04B 1/707 | 370/320 |
| 6,154,483 A * | 11/2000 | Davidovici | H04B 1/7085 | 370/336 |
| 6,297,691 B1 * | 10/2001 | Anderson | H04L 27/2273 | 329/300 |
| 6,477,208 B1 * | 11/2002 | Huff | H03M 13/41 | 375/265 |
| 6,625,231 B1 * | 9/2003 | Shen | H04L 27/22 | 375/226 |
| 7,180,970 B1 * | 2/2007 | Warnagiris | H04L 7/0008 | 375/354 |
| 8,576,736 B1 * | 11/2013 | Sigg | H04B 1/7075 | 370/252 |
| 8,804,875 B1 * | 8/2014 | Xu | H03D 5/00 | 375/327 |
| 8,989,316 B1 * | 3/2015 | Wang | H04L 27/2273 | 375/326 |
| 9,083,588 B1 * | 7/2015 | Xu | H03B 5/1228 | |
| 9,673,828 B1 * | 6/2017 | Xu | H04L 27/22 | |
| 9,673,829 B1 * | 6/2017 | Xu | H03D 3/007 | |
| 2003/0041667 A1 * | 3/2003 | White | H03L 7/0991 | 73/504.12 |
| 2003/0141938 A1 * | 7/2003 | Poklemba | H04L 27/02 | 332/103 |
| 2005/0105633 A1 * | 5/2005 | Lopez Villegas | H04L 27/06 | 375/269 |
| 2006/0023809 A1 * | 2/2006 | Lopez Villegas | H04L 27/22 | 375/324 |
| 2006/0193401 A1 * | 8/2006 | Lopez Villegas | H04L 27/2276 | 375/326 |
| 2007/0058753 A1 * | 3/2007 | Saavedra | H04L 27/0014 | 375/329 |
| 2008/0008285 A1 | 1/2008 | Smith et al. | | |
| 2010/0232548 A1 * | 9/2010 | Balakrishnan | H04L 1/0045 | 375/327 |
| 2011/0230154 A1 * | 9/2011 | Jacobsen | H04L 25/03057 | 455/205 |
| 2011/0242429 A1 * | 10/2011 | Noethlings | H04L 27/38 | 348/726 |
| 2012/0237204 A1 * | 9/2012 | Zhou | H04L 7/0075 | 398/25 |
| 2013/0223566 A1 * | 8/2013 | Linn | H04B 17/391 | 375/298 |
| 2014/0269999 A1 * | 9/2014 | Cui | H04L 27/3818 | 375/319 |
| 2016/0182219 A1 * | 6/2016 | Taylor | H04L 7/0075 | 398/115 |
| 2016/0254934 A1 * | 9/2016 | Xu | H04B 1/18 | 375/229 |
| 2016/0323127 A1 * | 11/2016 | Pande | H04B 1/40 | |
| 2017/0085405 A1 * | 3/2017 | Xu | H04L 27/2272 | |
| 2017/0134155 A1 * | 5/2017 | Chen | H04L 7/0041 | |
| 2018/0191539 A1 * | 7/2018 | Haran | H04L 27/20 | |
| 2018/0287646 A1 * | 10/2018 | Xu | H04L 27/38 | |
| 2020/0044900 A1 * | 2/2020 | Siligaris | H03B 19/00 | |

FOREIGN PATENT DOCUMENTS

| | | | | |
|---|---|---|---|---|
| CN | 102916743 A * | 2/2013 | | H03D 3/245 |
| CN | 102916743 A | 6/2013 | | |
| EP | 0530107 A1 * | 3/1993 | | H04L 27/2332 |
| WO | WO-8300783 A1 * | 3/1983 | | H04L 27/2275 |
| WO | WO-9214326 A1 * | 8/1992 | | H04L 27/2332 |
| WO | WO-9510909 A1 * | 4/1995 | | H04L 27/2332 |
| WO | WO-9727444 A1 * | 7/1997 | | F41G 3/2644 |
| WO | WO-2008008285 A2 * | 1/2008 | | H04L 27/34 |

OTHER PUBLICATIONS

Written Opinion of the International Searching Authority and International Search Report dated Nov. 19, 2019, for International Application No. PCT/EP2019/073264, with English translations.

* cited by examiner

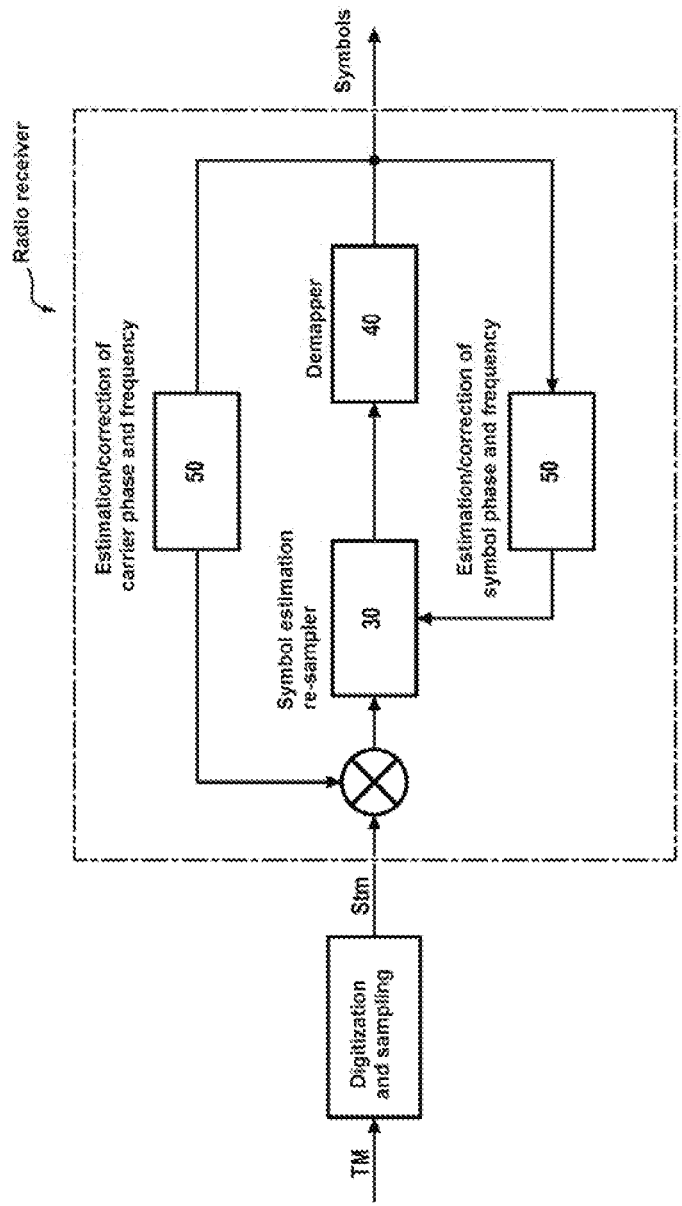

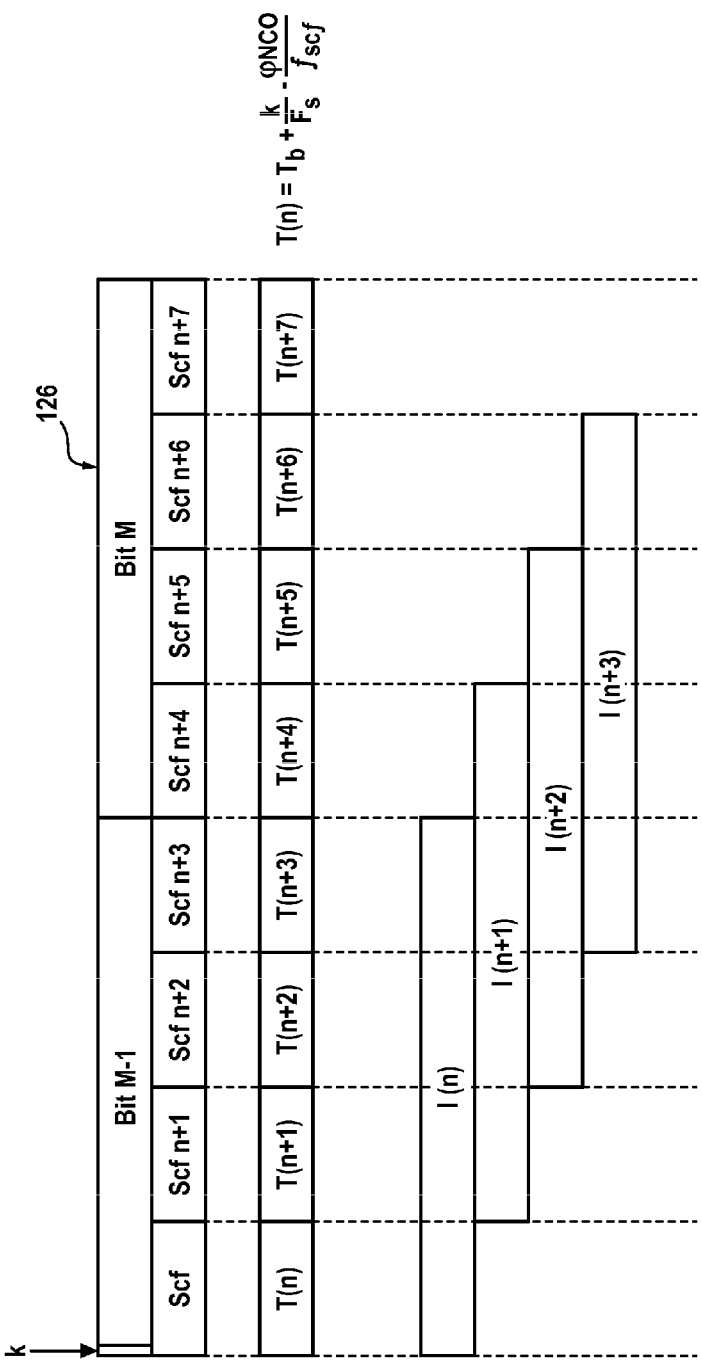

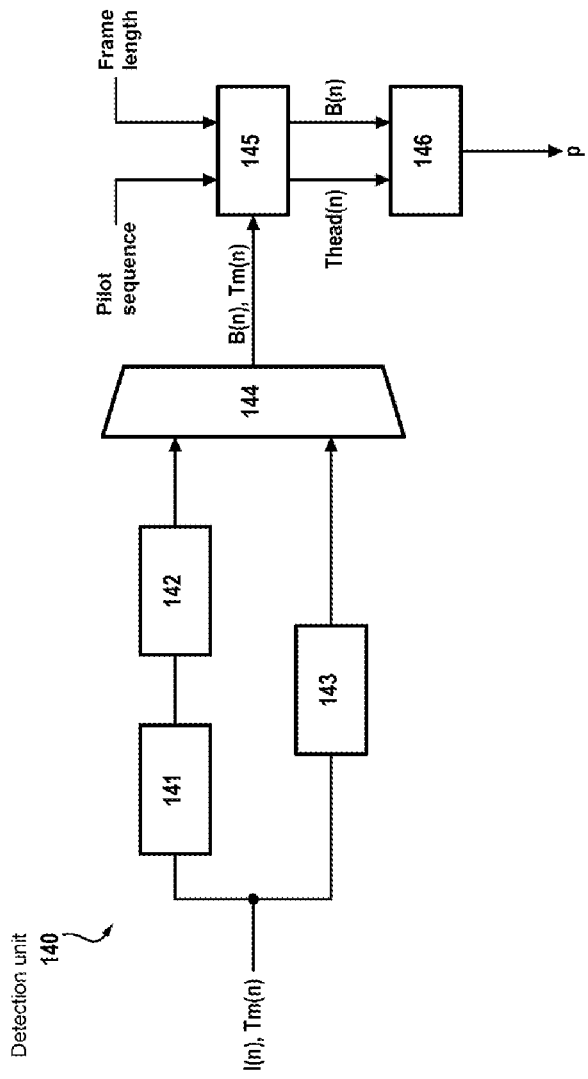

METHOD OF DATE-STAMPING TELEMETRY SIGNALS

FIELD OF THE INVENTION

The invention relates to a method of date-stamping of the reception of numerical data of a modulated signal.

Moreover, the invention relates to a telecommunications receiver receiving a modulated radio signal.

PRIOR ART

In the context of aircraft or spacecraft, it is necessary to be able to accurately locate them in space and time from the ground. Typically, in the technique of ranging, a measurement is taken of the travel times of a signal emitted by the craft or from the ground and received in several remote stations on the ground.

Many techniques exist: pulse ranging, semi-active ranging, and passive correlation ranging. The accuracy requirement often requires a signal to be emitted ad hoc, of sufficient bandwidth, with no jitter (signal fluctuation) and including characteristic markers (active or semi-active ranging). This solution has an intrinsic cost in terms of resources such as the specific transmission device, spectral consumption etc.

In the case of passive ranging techniques, opportunistic use is made of a telecommunications signal, but this signal is not always present (observation or LEO satellite) and requires the separate receiving and processing of large volumes of data.

It is also possible to use a ranging signal TM always present on crewed craft 10 (satellites, drones etc.) which is received in the control stations, and to date-stamp it at each of these stations, as illustrated FIG. 1. Thus, the different reception dates of the signal TM, TOA1 at the station 20A, TOA2 at the station 20B, make it possible to compute the differences in travel time between a craft and the different stations, and to then locate said craft by hyperbolic trilateration for example.

FIG. 2 illustrates the typical structure of a receiver of a ranging signal Stm from a control station, said signal Stm being obtained after sampling and asynchronous digitization of the signal TM.

Said receiver conventionally includes a demodulator/demapper unit 40 used to extract the symbols from the symbol stream, a unit 50 of estimation/correction of the phase and frequency separation between a local oscillator and the carrier, and a unit 60 of estimation of the symbol rate and phase. This demodulator is preceded by a re-sampler 30 capable of synthesizing samples representative of the signal Stm between those sampled at the inlet of said receiver. Thus, the re-sampler 30 can adjust the effective sampling frequency and interpolation phase use to re-time the intermediate samples synchronously with the symbols.

Specifically, it is important to sample the ranging signal exactly at the time of maximum opening of the eye diagram to obtain the symbol with the highest signal-to-noise ratio. Any offset from this time will significantly reduce the effective signal-to-noise ratio (SNR) seen by the following receiver units as well as the inter-symbol interference (ISI).

This conventional structure allows, on the condition that the receiver undergoes slaving (for example of Costas loop type) to an external reference clock (GPS type), to obtain an accuracy of date-stamping of the received signal in the order of the microsecond.

However, with such a receiver, it is not possible to improve the accuracy of the date-stamping. Specifically, as seen previously, the re-sampler performs the retiming at an optimal time vis a vis the symbol rate, which introduces a time-based jitter related to the random characteristic of the symbol sequence and the noise received in the passband. Such a process thus generates considerable jitter proportional to the input sampling period, in the order of the microsecond in the case of satellite ranging signals.

In the context of the location of aircraft or spacecraft, such an order of date-stamping accuracy proves insufficient to allow appropriate locating accuracy (error in the order of one of more kilometers).

There is therefore a need to improve ranging signal receivers to be able to propose more accurate date-stamping of the reception of such signals.

OVERVIEW OF THE INVENTION

The aim of the invention is to palliate the drawbacks of the prior art described above.

In particular, an aim of the invention is to propose a method for date-stamping digital data of a signal coherently modulating the carrier or sub-carrier, and taking advantage of the properties of such a modulation to improve the date-stamping thereof.

Such a method advantageously makes it possible to very accurately correct the date-stamping of a pilot sequence (known pattern), and considerably reduces the variance on the date-stamping of the transitions of the bits to allow, inter alia, better location of the mobile craft emitting such a ranging signal.

Another aim of the invention is to allow the method to make use of an existing ranging signal and thus to avoid the emission of other signals to take the distance measurement.

This method also makes it possible to increase the accuracy of resynchronization on board satellites not having a time-based reference of great accuracy, when this is done on the basis of the date of reception of a given sequence received on the ground, and the reception date of which is sent back on board.

Regarding this, the subject of the invention is a method of date-stamping of the reception of digital data of a modulated signal, said signal resulting from the modulation of a carrier or sub-carrier by a digital signal, the symbol rate of the digital signal being an integer sub-multiple N of the frequency of the carrier or sub-carrier, said method comprising the steps implemented by a processor of a telecommunications receiver consisting, after the reception and sampling of the modulated signal, in:

coherent demodulation by means of a phase loop of a plurality of samples sm(k) of the modulated signal and obtainment of a plurality of demodulated samples sdm(k) and of the phase of the reconstituted carrier combination of the plurality of demodulated samples sdm(k) with the simultaneous phase $\varphi(k)$ of the reconstituted carrier determination of a plurality of dates on which the phase of the reconstituted carrier transitions to a determined value $\varphi 0$, relative to the date of reception of at least one sample sm(k), according to a time offset during which the carrier rotates from $\varphi(k)$ to $\varphi 0$.

Advantageously, but optionally, the method according to the invention may further comprise at least one of the following features:

the coherent demodulation step comprises the sub-steps of:

a. detection of a phase error by a phase detector which erases the modulation of the received signal;
b. low-pass filtering of the phase error;

in the step of determination of the dates of transition to φ0, this date is computed in relation to the samples sm(k) of the modulated signal which immediately precede or follow a transition to φ0 of the phase of the reconstituted carrier;

the method further includes the steps of:
  selection of a symbol transition date from among the plurality of dates of transition to φ0, said symbol transition date corresponding to a time of transition of symbols of the digital signal;
  decimation by a factor N of the dates of transition to φ0, starting from said detected symbol transition date; and
  determination of the reception dates of a plurality of consecutive symbols corresponding to the dates of transition to φ0 resulting from the decimation;

the step of selection of the symbol transition date, comprises a sub-step of integration I(n) of the demodulated samples sdm (k) over a window of N consecutive samples of the signal;

the integration sub-step I(n) is carried out over durations of a symbol starting at each sample sdm(k) of the demodulated signal corresponding to a transition to φ0;

the integration sub-step also includes the:
c. computation for a plurality of consecutive indices p of the average value M(p) of the absolute value of said integration I(m), for m takes Ns values that all have a value of p modulo N, and
d. determination of the symbol transition date by selecting the transition to φ0 of index p which maximizes M(p);

the value of the integration I(n) starting at the symbol transition date provides the corresponding symbol of the digital signal;

the comparison of the values of M computed at the transitions to φ0 preceding M(n−1) and following M(n+1) the detected symbol transition makes it possible to characterize a phase ambiguity related to the modulation when these values are not substantially equal but that one is substantially equal to M(n);

the phase ambiguity is resolved by modifying the predetermined transition phase φ0 to another value;

the method also includes the decoding of the symbols into binary data;

the method also includes a frame synchronization step which comprises a second decimation by a factor Q equal to a predetermined size of a binary data frame, starting from a symbol transition date, and a step of determination of the reception dates of a plurality of consecutive frames corresponding to the dates of transition to φ0 resulting from the decimation; and the frame synchronization step further includes the selection of a frame having the best correlation with a determined pilot sequence, from among a plurality of consecutive frames and the step of determination of the reception date of said selected frame.

Moreover, the invention relates to a telecommunications receiver receiving a modulated radio signal, said signal resulting from the modulation of a carrier or sub-carrier by a digital signal, the symbol rate of the digital signal being an integer sub-multiple N of the frequency of the carrier or sub-carrier, said receiver comprising:
a demodulation unit configured for, after reception and sampling of the modulated signal, the:
  coherent demodulation by means of a phase loop of a plurality of samples sm(k) of the modulated signal and obtainment of a plurality of demodulated samples sdm(k) and of the phase of the reconstituted carrier;
  combination of the plurality of demodulated samples sdm(k) with the simultaneous phase φ(k) of the reconstituted carrier
  determination of a plurality of dates of transition to a determined value φ0 of the phase of the reconstructed carrier, relating to the reception date of at least one sample sm(k).

Advantageously, but optionally, the telecommunications receiver according to the invention can further comprise at least one of the following features:
a synchronization unit (130) configured for the:
  selection of a symbol transition date from among the plurality of dates of transition to φ0, said symbol transition date corresponding to a time of transition of symbols of the digital signal;
  decimation by a factor N of the dates of transition to φ0, on the basis of said detected symbol transition date; and
  determination of the reception dates of a plurality of consecutive symbols corresponding to the dates of transition to φ0 resulting from decimation.

Furthermore, the invention relates to a system of location of a spacecraft or aircraft implementing a method and/or a telecommunications receiver as claimed in one of the previously described features.

DESCRIPTION OF THE FIGURES

Other features, aims and advantages of the present invention will become apparent on reading the following detailed description, with reference to the appended figures, given by way of non-limiting example and wherein:

FIG. 2 already presented, represents a radio receiver of the prior art;

FIG. 6 schematically represents a step of integration implemented by the demodulation unit 120 according to the invention; and FIG. 7 schematically represents a unit 140 of detection of a radio receiver 100 according to the invention.

DETAILED DESCRIPTION OF AT LEAST ONE EMBODIMENT OF THE INVENTION

Satellite ranging, in accordance with the standards in effect (defined according to the Consultative Committee for Space Data Systems: CCSDS), transmits digital data, usually binary or "bits" which can modulate a carrier according to several methods, such as Phase Modulation (PM), Phase Shift Keying (PSK), and/or Pulse-Code Modulation (PCM). In all cases, it involves a coherent modulation of bits of the PSK carrier, which equates to saying that the symbol rate Rs is an integer sub-multiple N of the PSK carrier (or sub-carrier) frequency, Fp. Thus, in this context Fp=N×Rs.

A typical ranging system then includes a binary bitrate between 1400 and 31200 bits/second. The ratio of the frequency Fp of the carrier to the binary bitrate is typically between 4 and 16.

In the rest of the description, the term "carrier" can also be replaced by the term "sub-carrier". Specifically, seen from the modulated signal there is no need to differentiate between these terms, since the carrier PSK is also able to modulate another signal. The method described hereinafter thus applies interchangeably to a carrier or a sub-carrier.

Figure 1:
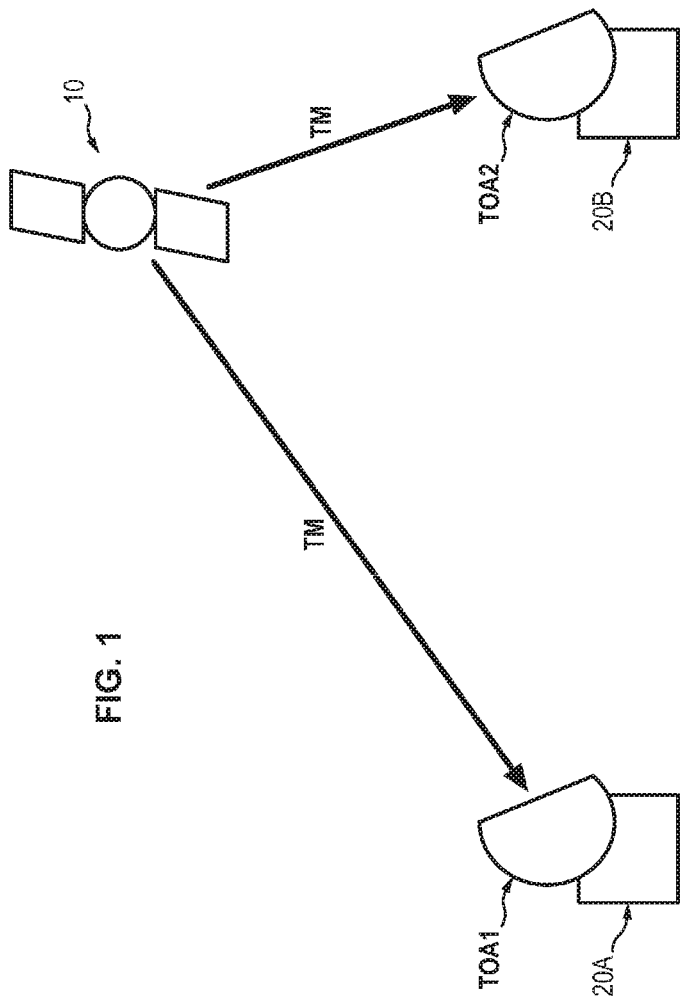
FIG. 1 already presented, represents a satellite ranging system of the prior art.
Figure 3A:
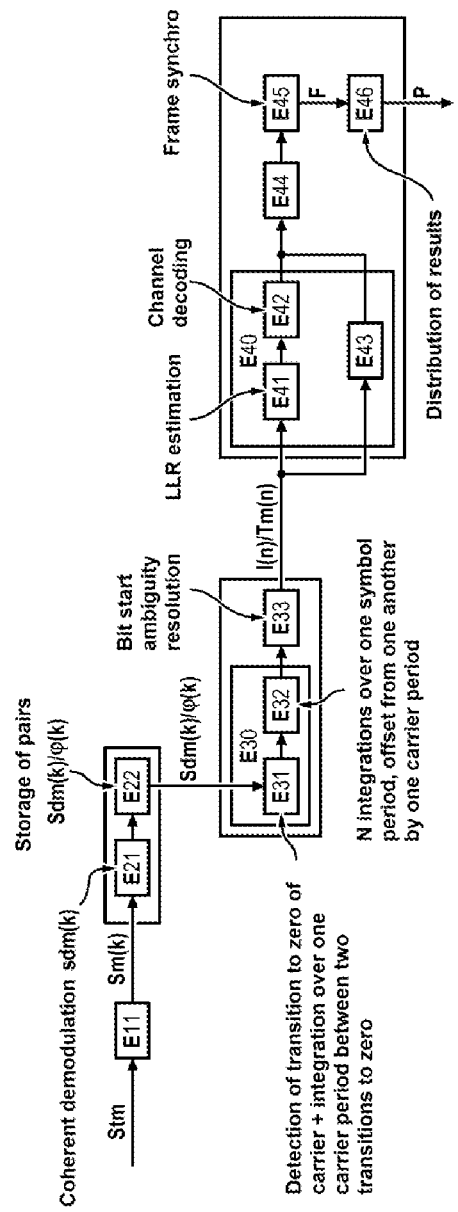
FIG. 3A represents the main steps of a date-stamping method implemented by a radio receiver according to the invention.

FIG. 3A illustrates a signal date-stamping method implemented by a radio communication receiver 100 receiving as input a radio signal, such as a ranging signal, coming from a satellite for example.

Figure 3B:
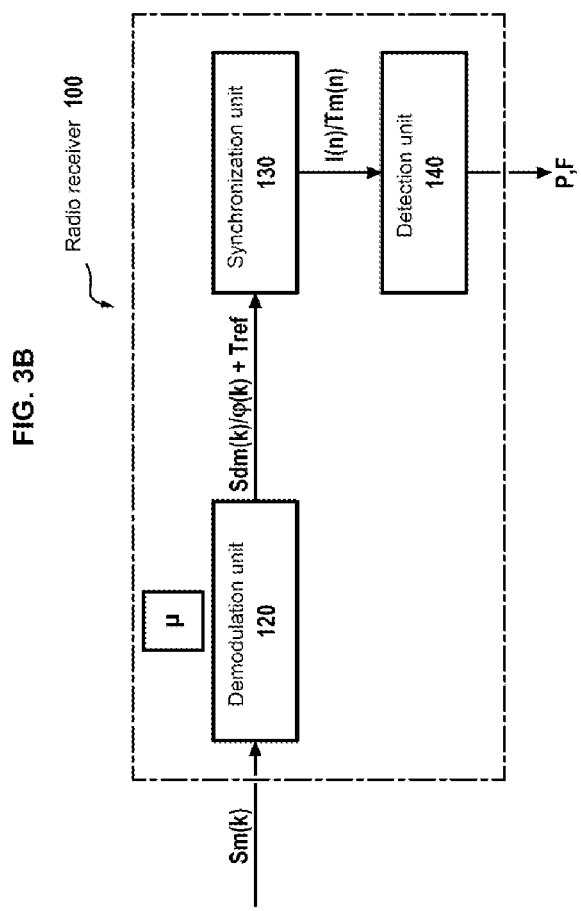
FIG. 3B schematically illustrates a radio receiver 100 according to the invention.

Such a radio receiver 100 is illustrated with reference to FIG. 3B. It comprises:
- a demodulation unit 120;
- a synchronization unit 130; and
- a pilot sequence detection unit 140.

Demodulation Unit

The receiver 100 receives a signal Stm, corresponding to a ranging signal TM previously sampled at a determined sampling rate Fe.

The sampling frequency Fe can be locked onto the local time base which means that the period Te=1/Fe is perfectly known without error or drift. The sampling dates are therefore exactly at k*Te with k an integer.

In addition, it can be admitted without limitation that the sampling obeys the Nyquist condition and therefore in particular that Fe>2 Fp which implies that we have at least two samples per phase rotation of the sub-carrier or carrier.

Figure 4:
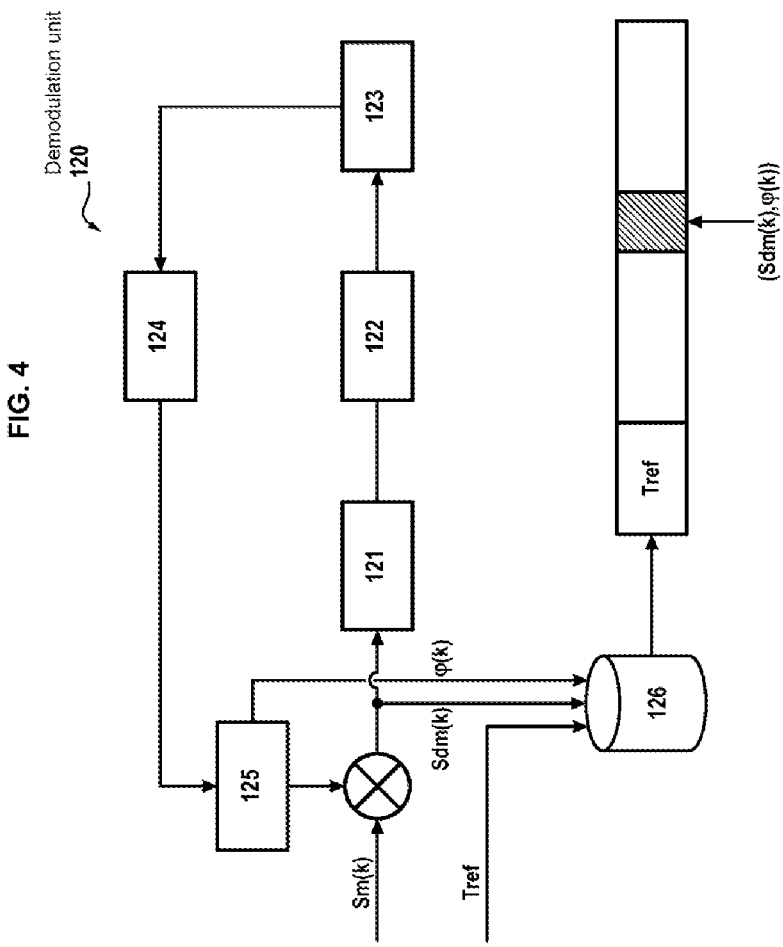
FIG. 4 schematically represents a unit 120 of demodulation of a radio receiver 100 according to the invention.

A demodulation unit 120 of the receiver, illustrated in FIG. 4, in a step E11, thus receives a plurality of samples Sm(k), where k is an index between 0 and Ne−1 where Ne denotes the number of samples of the portion of the radio signal, and constitutes blocks of samples. The unit 120 dates a sample k (for example the first) of a block of samples with a given date Tref. This date Tref can be defined with respect to a local time base of the receiver or slaved to a reference external to the receiver, for example an offset with respect to a GPS pulse (PPS), a counter of a clock synchronized with an external reference (example GPS 10 MHz), etc.

The demodulation unit 120 of the receiver 100 then performs, in a step E21, the demodulation of the accepted signal Sm(k) into Sdm(k). The demodulation unit 120 may comprise a suitable filtering block 121 which maximizes the signal-to-noise ratio of said signal.

The demodulation unit 120 also comprises a decimator block 122 of the demodulation unit 120 which makes it possible to reduce the number of samples to be processed later.

The unit 120 also comprises a phase-locked loop, implemented on the received signal Sm(k) by a phase detector block 123, and a loop filter block 124, said loop being slaved by a reference signal generated by an oscillator block 125, of NCO (Numerically-Controlled Oscillator) type for example.

The phase detector unit 123 generates an error signal that controls the phase-locked loop. Thus placed after the decimator block 122, the phase-locked loop 123 measures the difference between the phase of the signal generated by a local oscillator 125 and the phase of the carrier of the received signal Sm(k).

In the case where the modulation of the modulated signal Sm(k) has a phase ambiguity of order Netat, then the phase detector 123 must supply a zero error for the Netat phase values $$\left(\frac{2\pi p}{Netat} \text{ for integer } p\right)$$

that the modulation can take. The function of the phase detector 123 then has a periodicity of order Netat which is generally obtained by multiplying the phase by Netat.

The loop filter block 124 (often of second order to cancel out the constant phase bias) filters the phase error signal in order to supply a better signal to the oscillator block 125.

Again with reference to FIG. 3A, in a step E22, the unit 120 transmits to a synchronization unit 130 the date Tref, and a plurality of pairs combinating a demodulated sample Sdm(k) with the simultaneous phase φ(k) of the carrier reconstructed by the oscillator 125.

Advantageously, this supplying of the reconstructed phase combined with each sample makes it possible to refine the date-stamping.

In a particular embodiment, in step E22, a memory area 126, such as a buffer area, stores the date Tref combined with the plurality of pairs Sdm(k), φ(k) thus described.

Advantageously, knowing Tref makes it possible to know the precise date of each pair Sdm(k), φ(k) within this storage area since the samples are spaced apart by a period Te which is perfectly known.

Then said memory area 126 is transmitted to a synchronization unit 130.

At this stage, the receiver 100 therefore disposes of date-stamped samples, the carrier phase of which is fully informed with regard to the signal transmitted by the emitter.

Synchronization Unit (Date-Stamping)

A synchronization unit 130 receives as input the memory area 126 exiting the unit 120.

Figure 5:
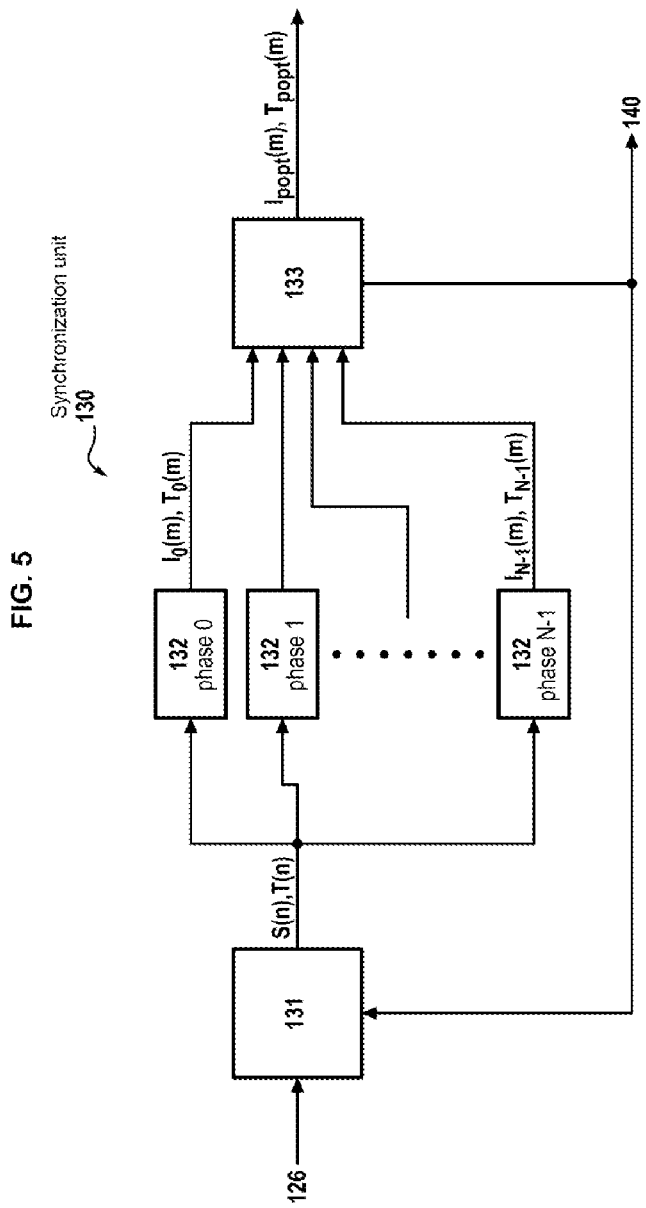
FIG. 5 schematically represents a unit 130 of synchronization of a radio receiver 100 according to the invention.

Thus, as illustrated in FIG. 5, an integration block 131 receives on its input the demodulated samples Sdm(k) accompanied by their reconstructed carrier phase φ(k) and the date-stamping Tref, for example via the memory area 126. Subsequently, it is considered that Tref is the time defined for k=0, k referencing the index of the sample in the memory area.

A symbol is illustrated with reference to FIG. 6, sampled into a plurality of samples k. There are several carrier periods Scf per symbol and several samples per carrier period Scf. Thus, Scf(n) represents the nth period of the carrier. The modulation of the symbols being coherent with the PSK carrier, the symbol rate Rs is an integer sub-multiple of the PSK carrier frequency denoted Fp=N×Rs, and therefore a symbol modulates the carrier over N periods thereof.

Thus, each symbol begins on one of the N transitions of the phase to one and the same determined value φ0. This determined value φ0 is, in principle (but not necessarily) close to zero, and in the rest of the description will be called "transition to zero/0" of the phase φ(k) of the reconstructed carrier.

In a step E30, the plurality of demodulated samples Sdm(k) accompanied by their reconstructed carrier phase φ(k) is processed to determine a set of samples k received as a function of the period of the carrier.

Thus, in a sub-step E31 of E30, the synchronization block 131 detects a transition to zero of the reconstituted carrier signal by detecting the transition to 0 ($\varphi$0 modulo 2$\pi$) of the phase $\varphi$(k). A time T(n) is that of the $n^{th}$ transition of the carrier to the phase 0, the period n of the carrier over which the signal sdm(k) will be integrated is defined between the times T(n) and T(n+1).

With each transition to 0 ($\varphi$0 modulo 2$\pi$), the integration block 131 performs the integration of the signal Sdm(k) over a period n of the carrier. At the next transition to 0, starting the period n+1, the integration block 131 reinitializes the integration computation which is reset to 0 and the result S(n) of the preceding integration is delivered simultaneously as output to a plurality of summation blocks 132 operating in parallel.

In a sub-step E31 of E30, each output S(n) is moreover combined with a date-stamp obtained by extrapolation of the date of the $k^{th}$ sample, for example according to the following formula valid for phases computed in radians: $T(n)=T_k+\Delta\varphi_k/2\pi F_p=\text{Tref}+k(n)*Te-[\varphi(k(n))-\varphi 0]/2\pi F_p$, k(n) corresponding to the index of the sample k designated as following the transition to 0 of the reconstructed phase.

The corrective term of T(n) which has a value of $[\varphi(k)-\varphi 0]/2\pi(F_p$ computes the exact time period separating the transition to zero of the phase of the carrier with the sample of index k and T(n) therefore accurately dates the transition to zero possibly corresponding to the start time of the symbol.

Alternatively, k could denote the index of the sample preceding the transition to zero of the reconstructed phase and the date-stamping of T(n) would then be: $T(n)=T_k+(2\pi-\Delta\varphi_k)/2\pi F_p=\text{Tref}+k(n)*Te+[2\pi+\varphi 0-(k(n))]/2\pi(F_p)$.

Note that here the transition to zero of the phase corresponds to $\varphi(k(n))\in]-\pi+\varphi 0, \varphi 0]$ and $\varphi(k(n)+1)\in[\varphi 0,+\pi\alpha\varphi 0]$ [which of necessity has a solution at each rotation since there are at least two samples per rotation. The phase values taken in this interval are therefore free of ambiguity to the nearest 2$\pi$.

Also, alternatively, the following formula of interpolation between the samples can be used:

$$T(n)=T_k+\Delta\varphi_k/(\varphi_{k+1}-\varphi_k)Te=\text{Tref}+[k(n)+(\varphi_0-\varphi_k)/(\varphi_{k+1}-\varphi_k)]*Te.$$

This latter formula is a little more accurate than the previous ones if the nominal value of Fp is used. However, they are equivalent if Fp takes the real instantaneous control value of the NCO since $(\varphi_{k+1}-\varphi_k)=2\pi Fp*Te$.

A conventional demodulation device would not have used the value of the reconstituted phase and would therefore not have finely date-stamped the transition to 0 but would have synchronized the rate by a timing recovery loop by adding a jitter (phase noise) inherent to this type of device.

The proposed device performs the integration of the signal to detect the symbols, but unlike a conventional demodulator does it before even having determined the times of transition between symbols.

Specifically, in an embodiment of the sub-step E32 of E30, N summation blocks 132 perform the integration in parallel over a window of N samples (i.e. one symbol) S(n) output by the block 131 via the following symbol integration function $I_p(m)=\Sigma_{j=j0+p+m*N}^{j=j0+p+m*N+N-}S(j)$ with $0\le p\le N-1$ denoting the number of the entity 132.

Each block 132 performs an integration offset by one carrier period. The plurality of blocks 132 makes it possible to perform a sliding integration over one symbol period thus covering all the possible cases for the determination of a symbol.

Other embodiments may compute these N integrals sequentially, as long as they are all recorded.

These N windows of parallel integrations $I_p(m)$ coming from the blocks 132 are used to supply a criterion for determining the block of N consecutive samples S(n) which covers a single symbol and which therefore starts of necessity at a transition to 0 of the carrier phase among the N consecutive possibilities. This determination of the transition to zero of the phase of the sub-carrier corresponding to the time of a transmitted symbol transition will be known in the rest of the document as the symbol start ambiguity resolution.

In addition, there may be several consecutively transmitted symbols of identical value. However, to determine the correct start period of a symbol, symbol transitions must be observed.

Thus, in a step E33, a block 133 performs the symbol start ambiguity resolution and selects the correct output $I_{p_{pot}}(m)$ after selecting the correct transition to zero $p_{opt}$ of the carrier corresponding to the symbol transition.

To do this, it computes the average of the absolute value of $I_p(m)$ form over a duration of Ns symbols (hereinafter denoted M(p)) and keeps the one that maximizes this value for p over 0 to N−1 and that will be denoted $p_{opt}$. The length Ns is determined beforehand as a function of the SNR and the symbol rate.

As long as the block 133 has found the correct output of index $p_{opt}$, the latter remains valid as long as the (sub)-carrier remains synchronized, i.e. the phase-locked loop is locked onto an intact signal.

Thus, henceforth, the block 133 performs a de facto decimation by N of the samples, and only the block 132 of index $p_{opt}$ remains necessary to the operation. Nevertheless, in an embodiment, all the blocks 132 are regularly activated to confirm the correct symbol synchronization.

The module 133 also detects the possible offset of one carrier half-period, in the context of a preferred embodiment of modulation with two states and 1/Netat more generally, of the integration performed in the block 131, in order to re-time the integration computation to make it coherent with the symbol transition.

Specifically, it can happen that the recovered carrier has several possible phase separation values with the phase of the (sub-) carrier of the received signal. This is what is known as the phase ambiguity phenomenon. Whatever the modulation used, the carrier is recovered with a phase ambiguity of $$\frac{2\pi}{Netat}$$

if Netat is the number of states of the modulation, which means in practice that $$\varphi 0 = \frac{2\pi p}{Netat}$$

with p taking an integer value between 0 and Netat−1.

This ambiguity comes from the carrier phase detection block 123 which, as described above, erases the modulation by delivering a zero value for the phase states of the modulation. The most commonly used method is to extract the carrier phase by multiplying the phase of the modulo 2*$\pi$ signal by Netat which creates the ambiguity modulo 2$\pi$/Netat.

Thus, in the case of modulation with two phase states, if the value M(p) defined above has been computed starting from the correct half-period over one carrier period, then M(p−1) is approximately equal to M(p+1) plus or minus the noise and M(p) is strictly greater than these two values.

In the contrary case, if the integrations have occurred over the incorrect half-period then M(p) is substantially equal to M(p−1) or M(p+1) since the peak is then shared on the position of one half-period before and one half-period after the correct phase position of the carrier.

To resolve the half-period ambiguity, in a preferred embodiment, the module 133 computes a threshold S0=(M(p modulo N)+min(M((p−1) modulo N),M((p+1) modulo N)))/2. Then, the module 133 counts the number of values above this threshold from among M(p modulo N), M((p−1) modulo N), M((p+1) modulo N).

In the case where there is no value above the threshold S0, then the integral of the symbol is computed over the correct half-period and is of maximum amplitude.

In the contrary case, the integrations have occurred over the incorrect half-period. It is then necessary to offset the integration by one half-period.

The block 133 thus determines the correct half-period and supplies this information to the block 131 which consequently detects the transition to 0 or to π (in fact φ0+π) of the phase φ(k) as a function of the selector of the starting half-period.

On its output, the block 133 supplies to each symbol of index i, at a rate corresponding to the rate of the carrier decimated by N, a pair of data (I(i), Tm(i)). I(i) being the integral of maximum amplitude $I(p_{opt})$ selected in the preceding step and Tm(i) being $T(p_{opt})$. Alternatively, T(i) may be a date averaged over a fixed time interval around $p_{opt}$ and offset by a fixed time period to indicate the middle or another predefined place in the symbol according to the date-stamping convention used.

This pair of data is supplied to a detection unit 140.

The information about the cycle and half-cycle offsets of the carrier vis a vis the symbol transitions is determined by the selector block 133 and returned to the block 131 in the aim of initializing the computations of data pairs by the synchronization unit 130. Said information can also be determined again and at regular intervals with the aim of checking the computations of data pairs by the synchronization unit 130.

In the case where the phase ambiguity is of an order greater than two, it is appropriate to somewhat modify the algorithm shown above. The general method consists in computing the symbol synchronization criterion used in the standard timing recovery loop for the modulation under consideration, this at the N possible positions of transition to zero, then in choosing the one that maximizes this criterion. For example, in the Costas loop for 4 states, a conversion of frequency into a complex number will be carried out in the demodulation unit 120 and the criterion becomes the maximum of M(n) computed at once on the channel I in phase and the channel Q in quadrature.

At this stage, the receiver 100 therefore disposes of an integral value I(p) corresponding to the value of a raw symbol (before decoding and decision) to be determined, said value being combined with a date-stamping of the time of transition to zero of the phase of the carrier starting the symbol.

Advantageously, this date-stamping is more accurate than that which would have been obtained by a conventional rate synchronization algorithm, as the latter introduces a jitter related to the intrinsic asynchronicity between the sampling rate of the signal and the symbol rate.

Detection Unit 140

The pilot sequence detection unit 140, illustrated in FIG. 7, then makes it possible to detect and date-stamp the first symbol, or any other predetermined symbol, of said sequence. This pilot sequence can be a sequence of symbols, encoded or otherwise, commonly known as a synchronization word, or for example a pure tone.

In a step E40, the data pair (I(i), Tm(i)) received from the unit 130 is processed to decode each selected sum I(i), by soft/hard decoding to estimate at least one most probable binary value. Hard decoding is used to process data that take a fixed and numerable set of possible values (for example 0 and 1), whereas soft decoding processes data defined in a range of values generally representing a likelihood.

Thus, in a sub-step E41 of E40, the pair of data (I(i), Tm(i)) received from the unit 130 is processed by a probability estimation block 141 of the unit 140, which presents on its output the probability that I(n) is equal to 1 or 0, in a step E41. The probability estimation unit 141 is for example of slicer circuit type. The probability is then processed, in a sub-step E42 of E40 by a decoding unit 142 according to the channel encoding that has been used (turbo encoding, LDPC, Viterbi, Reed-Solomon, etc.), The detection unit 140 also makes it possible, in a sub-step E43 of E40, to directly process I(i) in the case where the symbol sequence modulating the signal Stm does not come from an error corrector encoding for the transmission channel.

In this context, a decision block 143 determines the value of the symbol emitted by comparing I(i) to a threshold. For example, for a binary encoding where the symbols are bits, if I(i) is negative, the combined bit is equal to 0, and in the opposite case equal to 1 (hard bit decoding).

Depending on whether or not this channel encoding is present, a selection block 144, in a step E44, presents either the decoded signal, or the undecoded signal to a frame synchronization block 145.

In a step E45, the frame synchronization block 145 is also configured to detect a pilot sequence predefined to detect, in a frame of given length, Q bits. Conventionally, this detection is done by performing a sliding computation of the correlation of the bit sequence with the expected pilot sequence, the detection criterion being that which maximizes the absolute value of this correlation.

The frame synchronization block 145 therefore detects the pilot sequence every Q bits. In the event of detection, the unit 140 can present on its output Thead(j) the date $Tm(q_t)$ of the first bit B(q) of the detected sequence.

In a step E46, a packet generation block 146 receives this data and can then generate a message containing the date Thead(j), as well as a packet identifier Id(j) (for example, a frame counter number). The packet identifier Id(j) serves as a common reference between the packets generated by separate reception stations.

This packet is sent to the control center which can, on the basis of this information, determine the position of the mobile, for example by trilateration, by comparing the dates of packets having the same identifier Id(n), sent by at least two ranging signal reception stations.

The radio signal receiver 100 and the proposed method, by taking advantage of coherent modulation, make it possible to no longer re-sample the signal using, for example, a timing recovery loop to maintain throughout processing the coherence between sample and carrier phase. Advantageously, such a receiver 100/method makes it possible to measure with great accuracy the date-stamping of a pilot sequence, and considerably improves the variance on the date-stamping of symbol transitions to allow, inter alia, better locating of mobile craft emitting such a ranging signal. Thus, the implementation of such a receiver 100/ method makes it possible to achieve a standard deviation in the order of the nanosecond (considering the time base as perfect), and therefore an order of magnitude below that of GPS.

The invention claimed is:

1. A method of date-stamping of the reception of digital data of a modulated signal, said signal resulting from the modulation of a carrier or sub-carrier by a digital signal, the symbol rate of the digital signal being an integer sub-multiple N of the frequency of the carrier or sub-carrier, said method comprising the steps implemented by a processor of a telecommunications receiver consisting, after the reception and sampling of the modulated signal, in:
    coherent demodulation by means of a phase loop of a plurality of samples sm(k) of the modulated signal and obtainment of a plurality of demodulated samples sdm(k) and of the phase of the reconstituted carrier;
    combination of the plurality of demodulated samples sdm(k) with the simultaneous phase $\varphi(k)$ of the reconstituted carrier
    determination of a plurality of dates on which the phase of the reconstituted carrier transitions to a determined value $\varphi 0$, relative to the date of reception of at least one sample sm(k), according to a time offset during which the carrier rotates from $\varphi(k)$ to $\varphi 0$.

2. The method of date-stamping of the reception of digital data as claimed in claim 1, wherein the coherent demodulation step comprises the sub-steps of:
    a. detection of a phase error by a phase detector which erases the modulation of the received signal;
    b. low-pass filtering of the phase error.

3. The method of date-stamping of the reception of digital data as claimed in claim 1, for which, in the step of determination of the dates of transition to $\varphi 0$, this date is computed in relation to the samples sm(k) of the modulated signal which immediately precede or follow a transition to $\varphi 0$ of the phase of the reconstituted carrier.

4. The method of date-stamping of the reception of digital data as claimed in claim 1, further comprising the steps of:
    selection of a symbol transition date from among the plurality of dates of transition to $\varphi 0$, said symbol transition date corresponding to a time of transition of symbols of the digital signal;
    decimation by a factor N of the dates of transition to $\varphi 0$, starting from said detected symbol transition date; and
    determination of the reception dates of a plurality of consecutive symbols corresponding to the dates of transition to $\varphi 0$ resulting from the decimation.

5. The method of date-stamping of the reception of digital data as claimed in claim 1, wherein the step of selection of the symbol transition date, comprises a sub-step of integration I(n) of the demodulated samples sdm (k) over a window of N consecutive samples of the signal.

6. The method of date-stamping of the reception of digital data as claimed in claim 1, wherein the integration sub-step I(n) is carried out over durations of a symbol starting at each sample sdm(k) of the demodulated signal corresponding to a transition to $\varphi 0$.

7. The method of date-stamping of the reception of digital data as claimed in claim 1, wherein the integration sub-step also includes the:
    a. computation for a plurality of consecutive indices p of the average value M(p) of the absolute value of said integration I(m), for m taking Ns values that all have a value of p modulo N, and
    b. determination of the symbol transition date by selecting the transition to $\varphi 0$ of index p which maximizes M(p).

8. The method of date-stamping of the reception of digital data as claimed in claim 1, wherein the value of the integration I(n) starting at the symbol transition date provides the corresponding symbol of the digital signal.

9. The method of date-stamping of the reception of digital data as claimed in claim 7 wherein the comparison of the values of M computed at the transitions to $\varphi 0$ preceding M(n−1) and following M(n+1) the detected symbol transition makes it possible to characterize a phase ambiguity related to the modulation when these values are not substantially equal but one is substantially equal to M(n).

10. The method of date-stamping of the reception of digital data as claimed in claim 9, wherein the phase ambiguity is resolved by modifying the predetermined transition phase $\varphi 0$ to another value.

11. The method of date-stamping of the reception of digital data as claimed in claim 4, wherein the method also includes the decoding of the symbols into binary data.

12. The method of date-stamping of the reception of digital data as claimed in claim 11, further comprising a frame synchronization step which comprises a second decimation by a factor Q equal to a predetermined size of a binary data frame, starting from a symbol transition date, and a step of determination of the reception dates of a plurality of consecutive frames corresponding to the dates of transition to $\varphi 0$ resulting from the decimation.

13. The method of date-stamping of the reception of digital data as claimed in claim 12, wherein the frame synchronization step further includes the selection of a frame having the best correlation with a determined pilot sequence, from among a plurality of consecutive frames and the step of determination of the reception date of said selected frame.

14. A telecommunications receiver receiving a modulated radio signal, said signal resulting from the modulation of a carrier or sub-carrier by a digital signal, the symbol rate of the digital signal being an integer sub-multiple N of the frequency of the carrier or sub-carrier, said receiver comprising:
    a demodulation unit configured for, after reception and sampling of the modulated signal, the:
        coherent demodulation by means of a phase loop of a plurality of samples sm(k) of the modulated signal and obtainment of a plurality of demodulated samples sdm(k) and of the phase of the reconstituted carrier;
        combination of the plurality of demodulated samples sdm(k) with the simultaneous phase $\varphi(k)$ of the reconstituted carrier
        determination of a plurality of dates of transition to a determined value $\varphi 0$ of the phase of the reconstructed carrier, relating to the reception date of at least one sample sm(k).

15. The telecommunications receiver receiving a modulated radio signal as claimed in claim 14, said receiver also comprising:
    a synchronization unit configured for the:
        selection of a symbol transition date from among the plurality of dates of transition to $\varphi 0$, said symbol transition date corresponding to a time of transition of symbols of the digital signal;

decimation by a factor N of the dates of transition to φ0, on the basis of said detected symbol transition date; and determination of the reception dates of a plurality of consecutive symbols corresponding to the dates of transition to φ0 resulting from decimation.

* * * * *